Feb. 7, 1961 J. V. WILCOX ET AL 2,971,159

AMPLITUDE MODULATION ELIMINATOR

Filed Sept. 15, 1955 2 Sheets-Sheet 1

Jay V. Wilcox
John B. Stone
John L. Kennedy
INVENTORS.

BY [signature]
ATTORNEY.

AMPLITUDE MODULATION ELIMINATOR
Filed Sept. 15, 1955 2 Sheets-Sheet 2
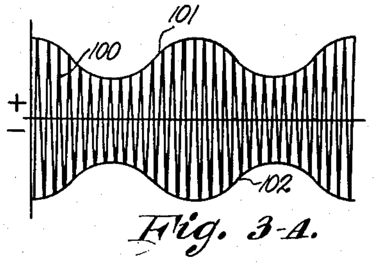
Fig. 3-A.
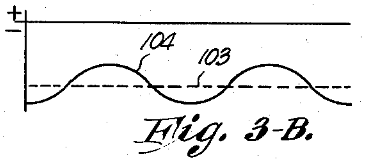
Fig. 3-B.
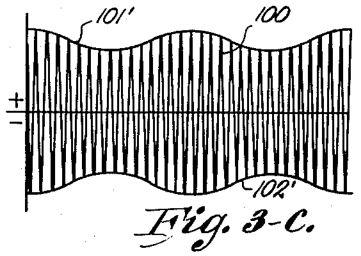
Fig. 3-C.
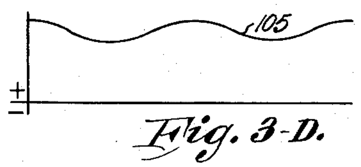
Fig. 3-D.
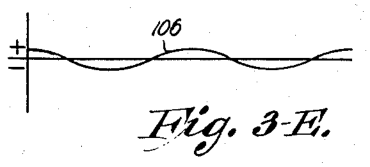
Fig. 3-E.
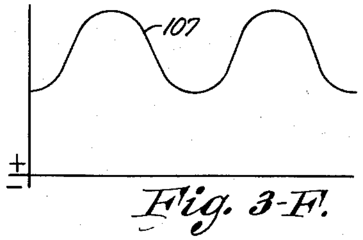
Fig. 3-F.
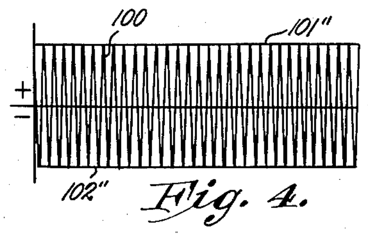
Fig. 4.
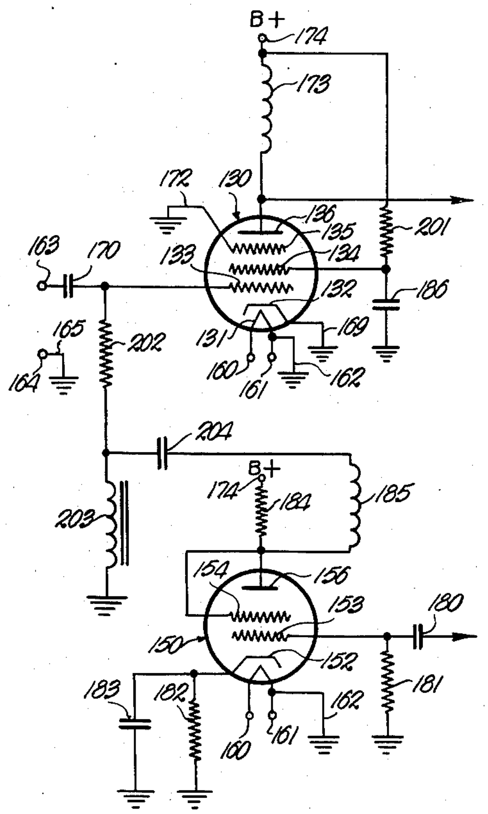
Fig. 5.
Jay V. Wilcox
John B. Stone
John L. Kennedy
INVENTORS.
BY [signature]
ATTORNEY.

2,971,159
Patented Feb. 7, 1961

2,971,159

AMPLITUDE MODULATION ELIMINATOR

Jay V. Wilcox, Blue Springs, and John B. Stone, Kansas City, Mo., and John L. Kennedy, Prairie Village, Kans., assignors to Wilcox Electric Company, Inc., Kansas City, Mo., a corporation of Kansas Filed Sept. 15, 1955, Ser. No. 534,444

3 Claims. (Cl. 328—165)

This invention relates to the field of electronic circuitry and, more particularly, to improved apparatus for removing undesired modulation from a radio frequency carrier signal.

Still more specifically, the invention relates to improved circuitry for removing the amplitude modulation from a radio frequency carrier signal, which carrier signal may itself be frequency modulated, without disturbing the frequency modulation characteristics of such signal.

The apparatus heretofore used for the removal or elimination of amplitude modulation from a carrier signal has conventionally comprised some form of peak clipper circuitry, the functioning of which notoriously involves the wastage of all of that power corresponding to the portion of the signal which is clipped in order to eliminate the modulation.

It is the primary object of this invention to overcome the above-mentioned and other disadvantages of the apparatus heretofore used for modulation elimination by the provision of improved modulation eliminator circuitry whose operation is dependent upon new principles not involving such power losses.

It is another important object of this invention to provide improved modulation eliminator circuitry of high efficiency which effectively removes amplitude modulation from a carrier signal without disturbing the other characteristics of the latter.

It is still another important object of this invention to provide improved modulation eliminator circuitry utilizing negative feed-back means associated with a radio frequency amplifier to remove amplitude modulation from a carrier signal passing through and amplified by such amplifier.

It is still another important object of the invention to provide improved modulation eliminator circuitry wherein a portion of the output from the plate circuit of a radio frequency amplifier is sampled, rectified, filtered, amplified (with a phase reversal), and then reapplied to the amplifier in such manner as to vary the transconductance thereof to vary the gain of such amplifier in accordance with the degree of amplitude modulation, if any, present in the output from the plate circuit of said amplifier.

Still other important objects of the invention will be made clear or become apparent as the following description of the invention progresses. In the accompanying drawings.

Figs. 3–A, 3–B, 3–C, 3–D, 3–E and 3–F are graphic representations of signal voltages appearing at various points hereinafter to be identified in the circuitry of Fig. 2;

Fig. 4 is a graphic representation of the unmodulated carrier output of the modulation eliminator apparatus of this invention when the latter is operated in its equilibrium condition hereinafter to be described; and Fig. 5 is a schematic diagram of a portion of a modified form of the modulation eliminator circuitry contemplated by this invention.

Although the field for application of modulation eliminator circuitry is well known to those skilled in the art to be of varied and relatively broad scope, one specific example of an application in which the circuitry of this invention may be used is in the transmitting equipment of a VOR or very high frequency omnirange ground station for use in the guidance of aircraft. It may be noted that in such VOR equipment there is normally fed to the transmitting antenna two separate signals derived from the same radio frequency carrier, one of which is amplitude modulated while the other is not amplitude modulated. In order that the two signals will be perfectly synchronized so that particular phase relationships between their respective signals can be interpreted by receiving equipment located in an aircraft, it is the common, if not adamant practice to derive both of such carrier signals from a common transmitter. It is found in practice that the frequency modulation of the carriers creates a certain amount of undesired amplitude modulation therein. Modulation eliminator apparatus is, therefore, employed to remove such undesired amplitude modulation component from one of the carriers before it is delivered to the antenna. It is in this application that the circuitry of this invention finds one of its advantageous uses.

Figure 1:
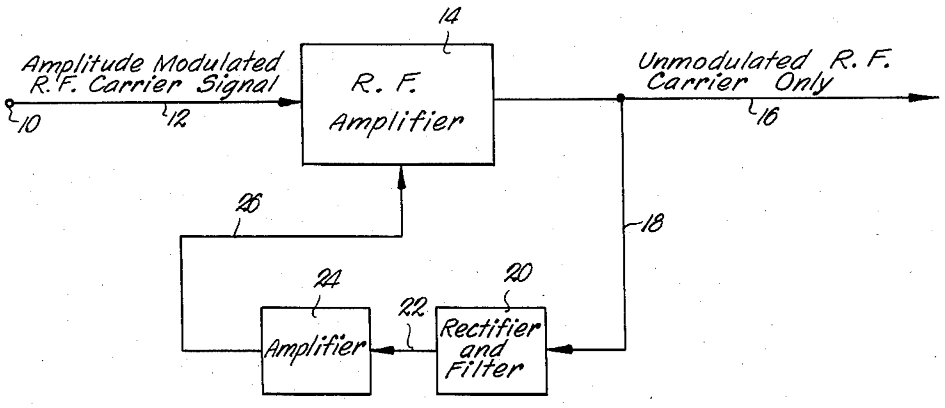
Fig. 1 is a block type diagram indicating broadly the elements utilized in the modulation eliminator circuitry contemplated by this invention.

Referring now to the accompanying drawings, and more particularly Fig. 1 thereof, the numeral 10 designates an input terminal to which may be applied a radio frequency carrier signal that carries undesired amplitude modulation components and which may be either of fixed frequency or frequency modulated as may be appropriate in the particular application in question. It will be understood that terminal 10 normally forms only one side of an input line, the other side of which will consist of ground and is not represented in Fig. 1. Terminal 10 is coupled by electrical coupling means 12 with the input of a radio frequency amplifier 14. The output of the radio frequency amplifier 14 is connected with coupling means 16 for carrying such output to a point of utilization. Coupled with coupling means 16 for sampling a portion of the output of the amplifier 14, is coupling means 18 which carries such sampled portion to rectifying and filtering means 20 which act to convert the portion of the high frequency, alternating current signal initially appearing in the output of amplifier 14 into a direct current output from rectifying and filtering means 20. Such direct current output from means 20 is of potential level varying at an audio frequency which corresponds to the degree of amplitude modulation present in the output from amplifier 14. Such varying direct current potential is connected by coupling means 22 with an amplifier 24 which amplifies and reverses the phase of such variations in the output from rectifying and filtering means 20. Such amplified and reversed phase, varying, direct current output from amplifier 24 is reapplied through direct coupling means 26 to radio frequency amplifier 14 as a negative feed-back signal which serves to decrease the transconductance and, therefore, the gain of radio frequency amplifier 14 in direct correspondence with the degree of amplitude modulation which may be present in the portion of the output on coupling means 16 which is sampled by coupling means 18. In view of the direct coupling of the output of amplifier 24 to radio frequency amplifier 14, it will be observed that the audio frequency component of the output from rectifier 20 is converted by amplifier 24 into an amplified, direct current output whose potential level varies in correspondence with the amplitude of such audio frequency component. Because of such action and the nature of such output, amplifier 24 will, for convenience, be sometimes hereinafter generally referred to as a "direct current" amplifier.

It will thus be clear that the operation of the improved modulation eliminator apparatus of this invention depends, at least in part, upon what might be broadly referred to as a negative feed-back system. Actually, however, the modulation elimination function of the apparatus of this invention is accomplished in two separate manners, the other of which will be later discussed. Both of such means for the elimination of amplitude modulation will be clarified in the explanation of detailed embodiments of the invention which follow.

Figure 2:
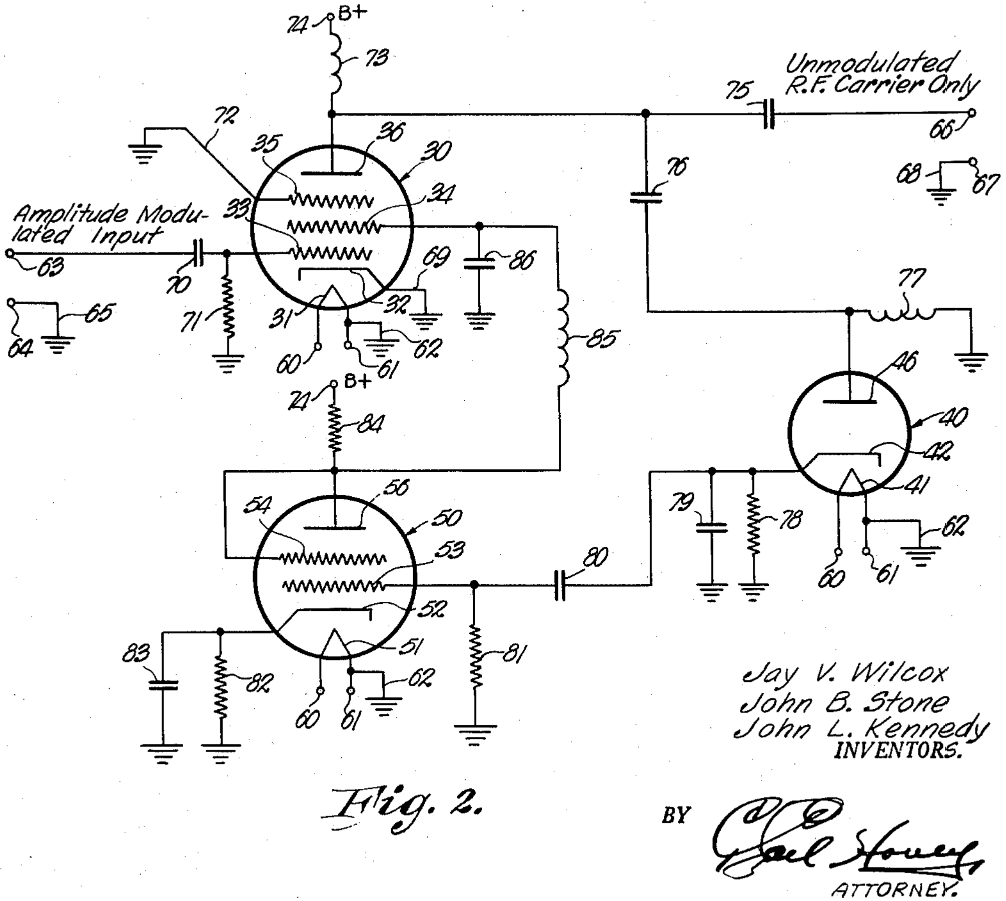
Fig. 2 is a schematic diagram of one embodiment of modulation eliminator apparatus made in accordance with the principles of this invention.

Referring now to Fig. 2 of the drawings, there is illustrated the preferred embodiment of the invention wherein a pentode radio frequency amplifying tube is generally designated 30, a diode rectifier tube is generally designated 40, and a tetrode, direct current amplifying tube is generally designated 50. Tube 30 is provided with a filament or heater 31, a cathode 32, a control grid 33, a screen grid 34, a suppressor grid 35 and a plate 36. Tube 40 is provided with a filament or heater 41, a cathode 42 and a plate 46. Tube 50 is provided with a filament or heater 51, a cathode 52, a control grid 53, a screen grid 54 and a plate 56. As will be apparent from the explanation of circuitry following, other types of vacuum tubes could be employed, if desired; for instance, tube 50 could be a triode, etc.

Each of tubes 30, 40 and 50 has its respective filament 31, 41 and 51 coupled with a source of heater current (not shown) through terminals 60 and 61, the latter of which is preferably grounded as at 62. A pair of input terminals 63 and 64 adapted for coupling with a source of radio frequency signals having undesired amplitude modulation thereon (not shown) are provided. Terminal 64 is preferably grounded as at 65. A pair of output terminals 66 and 67, the latter of which is preferably grounded as at 68, are provided and adapted for coupling with utilization means (not shown) to which is to be delivered a radio frequency carrier signal corresponding to that coupled with input terminals 63 and 64 but from which all components of amplitude modulation have been substantially removed.

Cathode 32 of tube 30 is grounded as at 69. Input terminal 63 is coupled with control grid 33 of tube 30 through a coupling capacitor 70. Control grid 33 is also coupled with ground through a grid resistance 71. Suppressor grid 35 is grounded as at 72. Plate 36 is coupled through a radio frequency choke 73 and a B-plus terminal 74 with a source of plate potential (not shown). Plate 36 is also coupled through a coupling capacitor 75 with output terminal 66 and through a coupling and blocking capacitor 76 with plate 46 of rectifier tube 40. Plate 46 is also coupled with ground through a radio frequency choke 77. Cathode 42 of tube 40 is coupled with ground through a filtering resistor 78 and a filtering capacitor 79 and, through a coupling capacitor 80 with control grid 53 of tube 50. Control grid 53 is also coupled with ground through a biasing resistance 81. Cathode 52 of tube 50 is coupled with ground through a cathode resistance 82 and a by-pass capacitor 83. Screen grid 54 is coupled with plate 56, and both of same are coupled through a resistance 84 with high voltage terminal 74 and, through a radio frequency choke 85, with screen grid 34 of amplifier tube 30. Screen grid 34 is by-passed to ground through a by-pass capacitor 86.

The operation of the circuitry of Fig. 2 just described will be best understood by reference to the curves illustrated in Figs. 3–A to 3–F inclusive and Fig. 4. In Fig. 3–A, the curve designated 100 represents a radio frequency carrier signal which is amplitude modulated as indicated by curves 101 and 102 such as normally might be applied to input terminals 63 and 64. In Fig. 3–B the dotted line curve 103 represents the level of bias which would prevail upon control grid 33 by virtue of the voltage drop across grid leak resistance 71 if the radio frequency carrier 100 without amplitude modulation 101 and 102 were applied to terminals 63 and 64. The curve 104 indicates the variation in level of bias upon grid 33 when an amplitude modulated radio frequency carrier, such as illustrated in Fig. 3–A, is applied to terminals 63 and 64. The output which would normally appear on plate 36 of radio frequency amplifier tube 30 in the absence of the feed-back circuit therefrom through tubes 40 and 50 to screen grid 34 is illustrated in Fig. 3–C and will be understood to indicate that, although no change other than amplification is made to the radio frequency carrier signal 100, the degree of amplitude modulation thereon as indicated by curves 101' and 102' has been decreased. Such effect just noted is due to the development across grid leak resistance 71 of a biasing voltage of the same frequency as the amplitude modulation on carrier 100 and in phase with the modulation envelope. Accordingly, the amplitude modulation is decreased as a result of such in phase biasing of grid 33 resulting from the modulation envelope itself. In effect, the input modulation envelope is utilized for providing grid bias type modulation of the class C amplifier tube 30, which is in opposition to the undesired modulation on the input signal. In practice, it is found that this feature by itself accounts for decreasing the amount of modulation present at the plate 36 of amplifier tube 30 by from 30% to 50%.

As will be apparent from the circuitry the output from plate 36 of tube 30 is applied through capacitor 76 to plate 46 of rectifier 40. The output signal appearing on cathode 42 of rectifier tube 40 is illustrated in Fig. 3–D by the curve 105. The filtering action of resistance 78 and capacitor 79 serve to remove any radio frequency components which may be present in such output from cathode 42, so that curve 105 may be considered as essentially a direct current potential varying in magnitude in phase with the modulation envelope of any amplitude modulation present on plate 36 of radio frequency amplifier 30. Fig. 3–E illustrates by curve 106 the varying direct current signal as it appears on grid 53 of the direct current amplifier tube 50. Tube 50 amplifies the variations in the direct current, modulation index signal 106 and also reverses the phase as indicated by curve 107 in Fig. 3–F, which represents the output at plate 56 of tube 50 and, accordingly, the input voltage applied to screen grid 34 of radio frequency amplifier tube 30.

It will be noted that curve 107, which represents the potential applied to screen grid 34 of tube 30 is directly out of phase with the modulation envelope of the amplitude modulation components of the signal applied to terminals 63 and 64. In other words, whenever the amplitude modulation of the signal applied to terminals 63 and 64 is at a peak value, the potential applied to screen grid 34 is at a corresponding minimum value. As is well known to those skilled in the art, variation of the potential applied to the screen grid 34 of pentode tube 30 will vary the transconductance and, therefore, the gain of the latter in accordance with the degree of change in potential on screen grid 34. When such potential is decreased, the gain of tube 30 will decrease, and when the potential on grid 34 is increased, the gain of tube 34 will increase.

What occurs by virtue of such action is that the mentioned variation of the gain of tube 30 follows the envelope of any amplitude modulation present in the output from plate 36 in such manner as to effectively cancel or eliminate substantially all of the amplitude modulation from such output. It will be apparent to those skilled in the art that, for any given level of amplitude modulation on the carrier applied to input terminals 63 and 64, the modulation eliminator circuit of this invention will quickly adjust to an equilibrium condition of cyclic gain variation adapted for elimination of such modulation from the output of tube 30, and will quickly readjust to any changes in the modulation level of the input signal to maintain the output essentially free from amplitude modulation, as indicated in Fig. 4 by the carrier envelope boundaries 101" and 102" of the radio frequency carrier signal 100. Obvious, also, is the manner in which the above-discussed grid modulation action, which occurs simultaneously with the feed-back action just described, cooperates with the latter to render the operation of the circuitry more efficient. With such circuitry, instead of the substantial power losses suffered with clipping type modulation eliminators, modest power gain (typically of the order of 15) is realized from input terminals 63 and 74 to output terminals 66 and 67, by virtue of the still substantial amplifying action of tube 30 even after the above-mentioned effects employed for modulation elimination.

In Fig. 5 is shown the changed portions of a variation of the circuitry of Fig. 2, wherein the negative feed-back from the amplifier tube 150 is applied to the control grid 133 of the radio frequency amplifier tube 130 simultaneously with the modulated carrier input from terminals 163 and 164. It will be understood that those reference numerals between 100 and 199 used in Fig. 5 correspond with and indicate the same respective structures as are numbered from 1 to 99 in Fig. 2; that is, the input terminals 163 and 164 in Fig. 5 are the same as terminals 63 and 64 in Fig. 2, the tube 130 of Fig. 5 corresponds with tube 30 of Fig. 2, etc. It will also be understood that, although not shown in the arrangement of Fig. 5, a rectifier tube corresponding with tube 40 of Fig. 2, output terminals corresponding with terminals 66 and 67 of Fig. 2, a filter corresponding with capacitor 79 and resistance 78 of Fig. 2 and parts corresponding with capacitors 75 and 76, choke 77, etc. are all provided and comparably connected.

In the modified arrangement, screen grid 134 is provided with its operating potential through a resistance 201 coupled with B plus terminal 174. The control grid 133 of tube 130 is coupled with ground through a series coupled resistance 202 and choke 203 having high impedance to audio frequencies, rather than simply through a resistance 71 as shown in Fig. 2. Finally, the output from the anode connected elements (plate 156 and grid 154) of amplifier tube 150 are coupled with control grid 133 of tube 130 through radio frequency choke 185, a capacitor 204 and resistance 202, the capacitor 204 being coupled between choke 185 and the point of interconnection of resistance 202 and choke 203.

As is apparent, the audio component of the output of amplifier tube 150 establishes a varying bias for grid 133 of tube 130 through the potential drop across audio choke 203. As is the case with the grid bias modulation envelope itself (see curve 104 of Fig. 3–B), the additional biasing of grid 133 due to the output of tube 150 is in phase with the modulation envelope (see curve 107 of Fig. 3–F). Accordingly, the effect of the application of the varying bias from tube 150 and choke 203 to grid 133 is again to effectively eliminate that portion of the amplitude modulation from the output of tube 130 which is not eliminated by the grid bias action of the modulation envelope itself, regardless of variation in the amount of amplitude modulation upon the carrier applied to terminals 163 and 164.

Manifestly, many other changes could be made without departing from the true spirit and intention of this invention. For example, a triode might be used for tube 30 or 130 with a corresponding reduction, however, in the sensitivity of response of transconductance or gain thereof to feed-back signals from tube 50 or 150; or a triode or pentode might be used for tube 50 or 150; or, with provision for another phase reversal, the feed-back signals from tube 50 or 150 might be applied to the cathode of tube 30 or 130; etc. Accordingly, it is to be understood that this invention is to be deemed limited only by the scope of the claims that follow.

Having thus described the invention, what is claimed as new and desired to be secured by Letters Patent is:

1. In modulation eliminator apparatus, a pair of input terminals adapted for coupling with a source of radio frequency signals having undesired amplitude modulation thereon; a pair of output terminals adapted for coupling with means for utilizing said signals after said modulation has been substantially eliminated therefrom; radio frequency amplifier means including a vacuum tube having internal elements including a cathode, an anode and signal input structure for controlling the flow of electrons from the cathode to the anode; means coupling the cathode with one of the input terminals and one of the output terminals; means coupling the anode with the other of said output terminals; means coupling the other of said input terminals with said structure; impedance means external to the tube coupling said structure with the cathode; means for applying a positive potential to the anode; rectifying means; means for amplifying and changing any audio frequency component of the signal from said rectifying means into a direct current signal of potential corresponding to the amplitude of said audio frequency component, said last-mentioned means including a second vacuum tube having internal elements including a cathode, a grid and a plate; means for applying a positive potential to the plate; means coupling the last-mentioned cathode with the first-mentioned cathode; impedance means external to the tube coupling said grid with said cathodes; means coupling said plate with said structure; and means coupling said rectifying means between said anode and said grid, said last-mentioned means including means between said anode and said rectifying means for blocking passage of direct current signals therethrough and means for blocking passage of radio frequency signals therethrough.

2. In the apparatus as set forth in claim 1, wherein said structure comprises a control grid coupled with said other input terminal and a screen grid coupled with said plate.

3. In the apparatus as set forth in claim 1, wherein said structure comprises a control grid coupled with said other input terminal and said plate.

References Cited in the file of this patent

UNITED STATES PATENTS

| | | |
|---|---|---|
| 2,128,996 | Foster | Sept. 6, 1938 |
| 2,167,511 | Hornung | July 25, 1939 |
| 2,265,689 | Dome | Dec. 9, 1941 |
| 2,367,923 | Booth | Jan. 23, 1945 |
| 2,379,688 | Crosby | July 3, 1945 |
| 2,399,091 | Bingley | Apr. 23, 1946 |
| 2,472,301 | Koch | June 7, 1949 |
| 2,505,550 | Ketchledge | Apr. 25, 1950 |
| 2,686,259 | Koch | Aug. 10, 1954 |